United States Patent Office 3,073,723

Patented Jan. 15, 1963

3,073,723

RESINOUS COATINGS ADAPTED TO RECEIVE A LIGHT-SENSITIVE LAYER IN THE PRODUCTION OF LITHOGRAPHIC PRINTING PLATES

Elmer F. Deal, West Covina, Isadore M. Richlin, San Gabriel, and Bruce W. Wilson, Pomona, Calif., assignors to Lithoplate, Inc., a corporation of California No Drawing. Filed Oct. 3, 1958, Ser. No. 765,043
22 Claims. (Cl. 117—161)

This invention relates to a lithographic plate base adapted to receive a light sensitive coating to provide a presensitized lithographic plate, methods of preparing such a base and to lithographic plates including such a base.

In recent years presensitized lithographic plates that can be converted into printing plates by merely exposing the presensitized plates to light source through a negative, stencil transparency or the like, followed by washing off the unreacted material have become quite common and widely used. For best results it is desirable that these presensitized plates be capable of being stored for appreciable periods of time in light excluding packages, that when exposed the resulting printing plate be scum free in a non-printing area and be tenaciously adherent to printing ink in the printing area. Thus, those portions of the printing plate where the light sensitive coating was not exposed to light through the blocking action of the negative must be hydrophilic and oleophobic in order to be non-adherent. Similarly those portions of the finished printing plate which were exposed to light must be hydrophobic and organophilic in order to produce a good clear image.

One of the features of this invention is to provide an improved lithographic plate base adapted to receive a light sensitive coating to provide a presensitized lithographic plate comprising a base member, and a coating thereon formed by applying to the base (1) a water dispersible member of the class consisting of amine modified urea-formaldehyde resins, alkali metal sulfurous acid salt modified urea-formaldehyde resins, alkylated methylol melamine resins, and melamine-formaldehyde-polyalkylenepolyamine resins, (2) a water dispersible member of the class consisting of polyhydroxy compounds, polycarboxy compounds, combined polyhydroxy-polycarboxy compounds and silica compounds, and (3) a water soluble salt of a metal group IV–B of the periodic table.

A further feature of the invention is to provide a method of making such a plate base comprising applying to a base member an aqueous dispersion of (1) a water dispersible member of the class consisting of amine modified urea-formaldehyde resins, alkali metal sulfurous acid salt modified urea-formaldehyde resins, alkylated methylol melamine resins, and melamine-formaldehyde-polyalkylenepolyamine resins at a concentration of about 0.1–2.0%, and an aqueous dispersion of (2) a water dispersible member of the class consisting of polyhydroxy compounds, polycarboxy compounds, combined polyhydroxy-polycarboxy compounds and silica compounds at a concentration of about 0.0035–10.0%, applying to the thusly coated base member an aqueous solution of (3) a water soluble salt of a metal of group IV–B of the periodic table at a concentration of about 0.01–10.0%, all said amounts being by weight, and washing said thusly coated base member with water.

The lithographic plate base of this invention permits the use of any base member desired such as metal sheet or foil, glass, synthetic plastic, wood, paper or other such material that is dimensionally and chemically stable. The reason for this is that the adherent barrier layer which is applied to at least one surface of the base member does not appear to chemically react with the base member but merely to intimately bond thereto. Of the metals a preferred base member is either copper, tin, aluminum, manganese, zinc or chromium, although others may of course be used if desired. A preferred aluminum base member is one described in Wood Patent 2,240,732 which is primarily aluminum containing about 1.25% manganese.

The lithographic plate has adhered to this base member a novel adherent barrier coating which seals the surface of the base member and particularly the metal base member in that there is no contact between the base member and the subsequently applied overlying light sensitive coating or sensitizer. As a result the presensitized plate of this invention has good shelf life and can be stored for long periods of time. In addition the barrier layer is hydrophilic and oleophobic so as to be scum preventing and to reduce tone in the resulting printing plate. Also, it is substantially free of water soluble material. A combination of this barrier layer and the subsequently applied sensitizer also produces extremely long runs of operation so that the printing plate may be used to make several thousand impressions.

The barrier layer is produced in a series of steps. In one step the base member has applied thereto an aqueous dispersion of a modified aldehyde condensation product. This resin may be any of four different types or a mixture of these. One such resin is an alkylated methylol melamine resin produced as described in the U.S. Patent No. 2,715,619. The disclosure of this reference is incorporated herein by reference. In general, the process described in this patent comprises the following steps (A) reaction of melamine with formaldehyde in a mixture containing controlled amounts of etherifying alcohol and water under alkaline conditions, (B) alkylation under acid conditions, with additional alcohol, if necessary, and (C) concentration of the neutralized syrup to remove the excess and unreacted alcohol.

Another resin that may be used on the base member is a polyalkylenepolyamine-melamine-formaldehyde resin produced as disclosed in U.S. Patent 2,796,362. The disclosure of this patent is also included herein by reference. The resins useful herein are characterized by content of at least five and preferably more than six mols of combined formaldehyde per mol of melamine with the number of nitrogen atoms in the polyalkylenepolyamine per mol of melamine being between 0.5 and 10.0 and the resin being cationic.

Another aldehyde resin that may be used in this process is the amine modified urea-formaldehyde resin disclosed in U.S. Patent 2,554,475. The disclosure of this patent is also included herein by reference.

These resins are infinitely water-dilutable polyfunctional compounds in which the polyfunctional amine contains at least two functional amino groups and are prepared generally by reacting a polyfunctional amine or salt thereof with urea and formaldehyde or with the condensation product of urea and formaldehyde at a pH and temperature such that there is no viscosity increase, followed by aging at a pH and temperature such that viscosity increases steadily at a controlable rate.

In a preferred process the urea and an aqueous solution of formaldehyde is reacted at from about 70–80° C. for about 15–30 minutes under alkaline conditions with the mol ratio of urea to formaldehyde being between 1:2–1:2.8 followed by adding thereto about 2–8% of a polyfunctional amine based on the weight of urea, adjusting the pH to between 1 and 4 and reacting by heating at a temperature of from about 68° C. to reflux temperature for about 15–180 minutes followed by reducing the temperature to one between about room temperature and 55° C.

Another resin that may be used is an alkali metal sulfurous acid salt modified urea-formaldehyde resin produced as described in U.S. Patent 2,559,578 which disclosure is include herein by reference.

The resin is preferably applied to the clean base member in an aqueous dispersion and then the excess is rinsed off after a preferably relatively short interval of time with running water which may be tap water. In the preferred process the resin is employed in an aqueous dispersion containing about 0.1 to 20.0% of the resin by weight and the base member is treated with this solution for a brief time, preferably from about 10 seconds to 5 minutes. The temperature of the dispersion is lower than the boiling point of water and for commercially satisfactory reasons is preferably from about room temperature to 185° F.

After application of the resin dispersion to the base member it is rinsed with water, preferably running water, which may be tap water.

As set out above the base member may be any dimensionally stable material and may include a base member made up of two or more layers. Thus it may be a paper sheet or plate impregnated with a resin such as a thermo-setting resin like phenol or urea-formaldehyde and the preferred resin either when used alone or in conjunction with a baking is a heat resistent thermoset resin. The term base member as used herein therefore includes sheet, film, foil, plate or other stable body. After the resin treated base member as set out above has been washed, as specified, it is coated with a dispersion and preferably an aqueous dispersion of either a polyhydroxy compound, a polycarboxy compound, a combined polyhydroxy-polycarboxy compound, a silica or silicon containing compound or the like that is soluble or dispersible in water. The essential nature of such a compound appears to be that it have in a water dispersion or solution an available supply of hydroxyl groups. These may be in very small number, as is evidenced by the fact that finely divided silica such as colloidal silica may be used. Among the many compounds that have been employed are glycerol, trialkylene glycol such as triethyleneglycol, polyhydroxylic acid such as gluconic, polyvinyl pyrrolidone, polyvinyl pyrrolidone-vinyl acetate copolymer, carboxymethyl cellulose, hydroxyethyl cellulose, carboxymethyl-hydroxyethyl cellulose and the salts thereof, finely divided silica such as Syton W–200 or Ludox in water dispersion, guar gum which is a polysacchardie, polyacrylamide, alkali metal silicates such as sodium silicate, gelatin, carboxypolymetheylene, styrenne-maleic acid copolymer and acrylic esters.

Where the compound is either a silicate containing compound or a polyhydroxy compound the aqueous dispersion preferably contains up to about 1% by weight of compound. Where the compound is a polycarboxy compound such as polycarboxylic acid or a combined polyhydroxy-polycarboxy acid compound the amount is preferably up to about 10% by weight. The above coating material is preferably applied in aqueous dispersion of a concentration of about 0.0035–10.0% of the material in water and at a preferred temperature between room temperature and 185° F. The application of the water dispersion compound may be as rapidly as practicable with a time between 5 seconds and 10 minutes being found most desirable for common commercial practice. As soon as the aqueous dispersion has been applied the plate is again rinsed with water that may be tap water.

As soon as the base member containing the first above defined coating is coated with the second coating it is contacted with a third material which is an aqueous solution of a water soluble compound of a metal of group IV–B of the periodic table. Thus the metals include zirconium, hafnium, titanium and thorium, with zirconium and hafnium being preferred. The metal compound is preferably a salt with the acid radical of the salt being any that will make the compound water soluble and that will not react with the base member of the previously applied coating thereon or with the subsequently applied sensitizer or light sensitive material. Typical salt groups are the acetates, nitrates and sulfates and these are relatively inexpensive and easy to obtain. Other salts may be used of course subject to the foregoing qualifications. The metal compound solution preferably has a concentration of 0.01–10.0% by weight and is preferably applied at a temperature of from room temperature to about 185° F. In each of the treating baths the upper limit of 185° F. is merely a practical upper limit as any temperature may be used below the boiling point of water. The treatment with the metal salt solution may be as rapidly as practical and in commercial instances has been found to be between 5 seconds and 10 minutes.

After application of the metal salt solution the plate is again rinsed off with water, preferably running water such as tap water. The resulting lithographic plate base may be stored as such and used later by application of the sensitizer as, for instance, it may be shipped to a user and the user himself may apply the sensitizer. If desired, and customarily, the sensitizer is applied by the manufacturer to produce a presensitized lithographic plate and the resulting plate may be stored in the dark for weeks and even months such as in a light proof storage package. The presensitized plate may then be used in the customary manner by exposing the light sensitive coating to a source of light such as ultraviolet light through a negative or the like, as previously described, followed by washing off the unreacted sensitizer and further treatment as is customary in this art before being used to produce printing sheets or the like.

The light sensitive material that is applied to the thusly produced plate base may be any of the usual types of materials including diazo compounds, bichromated casein and bichromated albumin. All these materials of course are capable of reacting with light and particularly ultraviolet light such as through a stencil or negative to form a lithographic printing image that is organophilic and hydrophobic and that is tightly bonded to the underlying layer.

The exposed light sensitive material thus provides a printing image while the material itself being water soluble can be washed away from the unexposed areas leaving the above described underlying hydrophilic surface free of the sensitizer. As is well known in this art the albumin sensitizer may be prepared by applying to the base a water solution of albumin that has previously been made sensitive to the action of light by the addition of a sensitizing agent such as ammonium chromate or dichromate. After the solution has been applied the plate is permitted to dry and is then ready to be exposed to light. Other such sensitized dispersions or solutions include halogenated polyvinyl alcohol in aqueous dispersion or solution as described in Patents 2,179,245; 2,199,865 and 2,342,175 or dispersions or solutions of proteins such as casein described in Patents 2,324,197; 2,324,198 and 2,500,453.

Typical diazo sensitizers are ideally suited for use with the prepared base of this invention and typical sensitizers of this type are described in Patents 2,100,063; 2,667,415; 2,679,498 and 2,772,972. Such a diazo compound is prepared by condensing paraformaldehyde with p-diazo-diphenylamine sulfate. One very effective diazo sensitizer is a 2% aqueous solution of N,N'-4,4'-biphenylene-bis[6,5-diazo-5,6-oxo-1 naphthalenesulfoamide] in dimethyl formamide. The aqueous dispersion or solution of the sensitizer or light sensitive material may be applied to the prepared base by dipping, spraying, roller coating, brushing or the like which are all conventional in this art.

When a metal plate such as an aluminum plate is used as the base metal the plate is preferably oxidized although the unoxidized surface may be used if desired. This oxidizing of aluminum, for example, is accomplished in the customary and well known manner either by using an oxidizing agent or electrolytically. One way of oxidizing aluminum is by applying thereto a 2% solution of chromic acid in water at 150° F. This is a well known and customary oxidizing method.

Wherever the term water dispersible is used herein it is intended to include both water soluble and molecular and multimolecular dispersions as well as those dispersions that are dilutable with water.

The metal compounds of group IV–B of the periodic table used in this invention appear to act as agents in curing the two previously applied coatings. Although the exact nature of the action has not been proven chemically it appears that each of the three coatings appear to interact to form a single layer that is adherent to both the base member and to the light exposed sensitizer. The first coating is of course the aldehyde condensation product resin compound, and the second coating is the polyhydroxy, polycarboxy or polyhydroxy-polycarboxy compound or the silica compound.

As previously described these may be heterocyclic ketones such as polyvinyl pyrrolidone or its monomer, vinyl pyrrolidone or its copolymer with vinyl acetate, polymeric acids such as polyacrylic acid and salts thereof as well as the amides such as polyacrylamide and they also include the monomer of such acids as, for example, acrylic acid. The compounds may include the polysaccharides such as guar gum or locust bean gum which are galacto-mannans, polymeric alcohol such as polyvinyl alcohol and cellulosic derivatives such as hydroxyethyl cellulose, carboxymethyl cellulose and hydroxyethyl-carboxymethyl cellulose. In general, the compounds are those which are water soluble or dispersible, which are substantive to the resin treated surface and which are reactive to the above described metal curing agents.

The following examples are illustrative only of the many methods of preparing the base plate of this invention.

*Example 1*

A thin sheet of aluminum was etched and cleaned by washing for three minutes at 145° F. in a 10% aqueous solution of anhydrous trisodium phosphate. The thusly treated aluminum sheet was then rinsed with a spray of tap water for three minutes. It was then desmutted by immersion in a bath of 2% chromic acid and .8% sulfuric acid in water for three minutes at room temperature. At the end of this time the sheet was rinsed for three minutes in a spray of tap water. The sheet was then immersed for two minutes in a 3% aqueous dispersion of resin prepared as described in Patent 2,796,362. The plate was again rinsed in tap water. The plate was then immersed for about three minutes in a 0.7% aqueous solution of carboxymethyl cellulose containing 2% of gluconic acid. The plate was immersed in this bath for about 10 seconds and then removed and rinsed with a tap water spray. The plate was then immersed in a 1% aqueous solution of zirconium acetate salt and the treated sheet was then again rinsed in tap water and dried. The thusly treated sheet was then ready for a coating of sensitizer. In this example the sensitizer was a customary aqueous dispersion of bichromated casein of the type described in Patent 2,324,197.

*Example 2*

In this example the procedure was essentially the same as given above in Example I except that here the metal curing agent was titanium lactate and carboxymethyl-hydroxyethyl cellulose was used instead of the cellulose derivative-acid mixture.

*Example 3*

In this example the procedure was the same as in Example 1 except that here titanium lactate was used instead of zirconium acetate.

*Example 4*

In this example the procedure was essentially the same as that of Example 1 except that here a 2.0% dispersion of Syton W–200 and 0.25% aqueous solution of gluconic acid was substituted for the carboxymethyl cellulose-gluconic acid solution.

*Example 5*

The procedure of Example 1 was again followed but here the plate was mild steel instead of aluminum. In a second embodiment of this invention the sheet was zinc.

*Example 6*

In this example the same procedure as in Example 1 was followed except that here the resin used was one prepared according to Example 1 of Patent 2,559,578.

*Example 7*

Here a plate similar to Example 1 was prepared but the resin was one prepared by the method of Example 2 of Patent 2,554,475.

*Example 8*

In this example the procedure was the same as in Example 1 but the resin was one prepared according to Example 1 of Patent 2,715,619.

Having described our invention as related to the embodiments set out herein, it is our intention that the invention be not limited by any of the details of description, unless otherwise specified, but rather be construed broadly within its spirit and scope as set out in the accompanying claims.

We claim:

1. A plate base adapted to receive a light sensitive layer to provide a presensitized lithographic plate, comprising: a base member; and a coating thereon formed by applying to the base member (1) a water dispersible resin of the class consisting of amine modified urea-formaldehyde resins, alkali metal sulfurous acid salt modified urea-formaldehyde resins, alkylated methylol melamine resins, and melamine-formaldehyde-polyalkylenepolyamine resins, (2) a water dispersible member of the class consisting of polyhydroxy organic compounds and polycarboxy compounds, and (3) as a curing agent, a water soluble salt alone and prior to the application of said light sensitive layer, said salt being that of a metal of the class consisting of zirconium, hafnium, titanium and thorium, said coating being substantially free of unreacted salts of said metal.

2. A plate base adapted to receive a light sensitive layer to provide a presensitized lithographic plate, comprising: a base member; and a coating thereon formed by applying to the base member (1) a water dispersible amine modified urea-formaldehyde resin, (2) a water dispersible member of the class consisting of polyhydroxy organic compounds and polycarboxy compounds, and (3) as a curing agent, a water soluble salt alone and prior to the application of said light sensitive layer, said salt being that of a metal of the class consisting of zirconium, hafnium, titanium and thorium, said coating being substantially free of unreacted salts of said metal.

3. A plate base adapted to receive a light sensitive layer to provide a presensitized lithographic plate, comprising: a base member; and a coating thereon formed by applying to the base member (1) a water dispersible alkali metal sulfurous acid salt modified urea-formaldehyde resin, (2) a water dispersible member of the class consisting of polyhydroxy organic compounds and polycarboxy compounds, and (3) as a curing agent, a water soluble salt alone and prior to the application of said light sensitive layer, said salt being that of a metal of the class consisting of zirconium, hafnium, titanium and thorium, said coating being substantially free of unreacted salts of said metal.

4. A plate base adapted to receive a light sensitive layer to provide a presensitized lithographic plate, comprising: a base member; and a coating thereon formed by applying to the base member (1) a water dispersible alkylated methylol melamine resin, (2) a water dispersible member of the class consisting of polyhydroxy organic compounds and polycarboxy compounds, and (3) as a curing agent, a water soluble salt alone and prior to the application of said light sensitive layer, said salt being that of a metal of the class consisting of zirconium, hafnium, titanium and thorium, said coating being substantially free of unreacted salts of said metal.

5. A plate base adapted to receive a light sensitive layer to provide a presensitized lithographic plate, comprising: a base member; and a coating thereon formed by applying to the base member (1) a water dispersible melamine-formaldehyde-polyalkylenepolyamine resin, (2) a water dispersible member of the class consisting of polyhydroxy organic compounds and polycarboxy compounds, and (3) as a curing agent, a water soluble salt alone and prior to the application of said light sensitive layer, said salt being that of a metal of the class consisting of zirconium, hafnium, titanium and thorium, said coating being substantially free of unreacted salts of said metal.

6. The method of making a plate base adapted to receive a light sensitive layer to provide a presensitized lithographic plate, comprising: forming a coating by applying to a base member an aqueous dispersion of (1) a water dispersible member of the class consisting of amine modified urea-formaldehyde resins, alkali metal sulfurous acid salt modified urea-formaldehyde resins, alkylated methylol melamine resins, and melamine-formaldehyde-polyalkylenepolyamine resins, an aqueous dispersion of (2) a water dispersible member of the class consisting of polyhydroxy organic compounds and polycarboxy compounds, and (3) as a curing agent, an aqueous solution of a water soluble salt alone and prior to the application of said light sensitive layer, said salt being that of a metal of the class consisting of zirconium, hafnium, titanium and thorium, said coating being substantially free of unreacted salts of said metal.

7. The method of making a plate base adapted to receive a light sensitive layer to provide a presensitized lithographic plate, comprising: forming a coating by applying to a base member an aqueous dispersion of (1) a water dispersible member of the class consisting of amine modified urea-formaldehyde resins, alkali metal sulfurous acid salt modified urea-formaldehyde resins, alkylated methylol melamine resins, and melamine-formaldehyde-polyalkylenepolyamine resins at a concentration of about 0.1–2.0%, an aqueous dispersion of (2) a water dispersible member of the class consisting of polyhydroxy organic compounds and polycarboxy compounds at a concentration of about 0.0035–10%, and (3) as a curing agent, an aqueous solution of a water soluble salt alone and prior to the application of said light sensitive layer, said salt being that of a metal of the class consisting of zirconium, hafnium, titanium and thorium, said coating being substantially free of unreacted salts of said metal, the salt being at a concentration of about 0.01–10%, all said amounts being by weight; and washing said thusly coated base member with water.

8. The method of claim 7 wherein the member of the first-mentioned class is amine modified urea-formaldehyde resin.

9. The method of claim 7 wherein the member of the first-mentioned class is an alkali metal sulfurous acid salt modified urea-formaldehyde resin.

10. The method of claim 7 wherein the member of the first-mentioned class is an alkylated methylol melamine resin.

11. The method of claim 7 wherein the member of the first-mentioned class is a melamine-formaldehyde-polyalkylenepolyamine resin.

12. A plate base adapted to receive a light sensitive layer to provide a presensitized lithographic plate, comprising: a base member; and a coating thereon formed by applying to the base member (1) a water dispersible resin of the class consisting of amine modified urea-formaldehyde resins, alkali metal sulfurous acid salt modified urea-formaldehyde resins, alkylated methylol melamine resins, and melamine-formaldehyde-polyalkylene-polyamine resins, (2) a water dispersible film forming cellulose polymer, and (3) as a curing agent, a water soluble salt alone and prior to the application of said light sensitive layer, said salt being that of a metal of the class consisting of zirconium, hafnium, titanium and thorium, said coating being substantially free of unreacted salts of said metal.

13. A plate base adapted to receive a light sensitive layer to provide a presensitized lithographic plate, comprising: a base member; and a coating thereon formed by applying to the base member (1) a water dispersible resin of the class consisting of amine modified urea-formaldehyde resins, alkali metal sulfurous acid salt modified urea-formaldehyde resins, alkylated methylal melamine resins, and melamine-formaldehyde-polyalkylene-polyamine resins, (2) a water dispersible film forming carboxy-lower alkyl cellulose polymer, and (3) as a curing agent, a water soluble salt alone and prior to the application of said light sensitive layer, said salt being that of a metal of the class consisting of zirconium, hafnium, titanium and thorium, said coating being substantially free of unreacted salts of said metal.

14. A plate base adapted to receive a light sensitive layer to provide a presensitized lithographic plate, comprising: a base member; and a coating thereon formed by applying to the base member (1) a water dispersible resin of the class consisting of amine modified urea-formaldehyde resins, alkali metal sulfurous acid salt modified urea-formaldehyde resins, alkylated methylol melamine resins, and melamine-formaldehyde-polyalkylenepolyamine resins, (2) a water dispersible film forming member of the class consisting of carboxymethyl cellulose and carboxymethyl-hydroxyethyl cellulose polymer, and (3) as a curing agent, a water soluble salt alone and prior to the application of said light sensitive layer, said salt being that of a metal of the class consisting of zirconium, hafnium, titanium and thorium, said coating being substantially free of unreacted salts of said metal.

15. A plate base adapted to receive a light sensitive layer to provide a presensitized lithographic plate, comprising: a base member; and a coating thereon formed by applying to the base member (1) a water dispersible resin of the class consisting of amine modified urea-formaldehyde resins, alkali metal sulfurous acid salt modified urea-formaldehyde resins, alkylated methylol melamine resins, and melamine-formaldehyde-polyalkylene-polyamine resins, (2) a water dispersible film forming cellulose polymer, and (3) as a curing agent, a water soluble zirconium salt alone and prior to application of said light sensitive layer, said coating being substantially free of unreacted zirconium salt.

16. A plate base adapted to receive a light sensitive layer to provide a presensitized lithographic plate, comprising: a base member; and a coating thereon formed by applying to the base member (1) a water dispersible resin of the class consisting of amine modified urea-formaldehyde resins, alkali metal sulfurous acid salt modified urea-formaldehyde resins, alkylated methylol melamine resins, and melamine-formaldehyde-polyalkylene-polyamine resins, (2) a water dispersible film forming cellulose polymer, and (3) as a curing agent, a water soluble hafnium salt alone and prior to the application of said light sensitive layer, said coating being substantially free of unreacted hafnium salt.

17. A plate base adapted to receive a light sensitive layer to provide a presensitized lithographic plate, comprising: a base member; and a coating thereon formed by applying to the base member (1) a water dispersible resin of the class consisting of amine modified urea-formaldehyde resins, alkali metal sulfurous acid salt modified urea-formaldehyde resins, alkylated methylol melamine resins, and malamine-formaldehyde-polyalkylene-polyamine resins, (2) a water dispersible film forming cellulose polymer, and (3) as a curing agent, a water soluble titanium salt alone and prior to the application of said light sensitive layer, said coating being substantially free of unreacted titanium salt.

18. A plate base adapted to receive a light sensitive layer to provide a presensitized lithographic plate, comprising: a base member; and a coating thereon formed by applying to the base member (1) a water dispersible resin of the class consisting of amine modified urea-formaldehyde resins, alkali metal sulfurous acid salt modified urea-formaldehyde resins, alkylated methylol melamine resins, and melamine-formaldehyde-polyalkylene-polyamine resins, (2) a water dispersible film forming cellulose polymer, and (3) as a curing agent, a water soluble thorium salt alone and prior to the application of said light sensitive layer, said coating being substantially free of unreacted thorium salt.

19. The method of making a plate base adapted to receive a light sensitive layer to provide a presensitized lithographic plate, comprising: forming a coating by applying to a base member an aqueous dispersion of (1) a water dispersible member of the class consisting of amine modified urea-formaldehyde resins, alkali metal sulfurous acid salt modified urea-formaldehyde resins, alkylated methylol melamine resins, and melamine-formaldehyde-polyalkylenepolyamine resins at a concentration of about 0.1–2.0%, an aqueous dispersion of (2) a water dispersible film forming cellulose polymer at a concentration of about 0.0035–10%, and (3) as a curing agent, an aqueous solution of a water soluble salt alone and prior to the application of said light sensitive layer, said salt being that of a metal of the class consisting of zirconium, hafnium, titanium and thorium, said coating being substantially free of unreacted salts of said metal, the salt being at a concentration of about 0.01–10%, all said amounts being by weight; and washing said thusly coated base member with water.

20. The method of making a plate base adapted to receive a light sensitive layer to provide a presensitized lithographic plate, comprising: forming a coating by applying to a base member an aqueous dispersion of (1) a water dispersible member of the class consisting of amine modified urea-formaldehyde resins, alkali metal sulfurous acid salt modified urea-formaldehyde resins, alkylated methylol melamine resins, and melamine-formaldehyde-polyalkylenepolyamine resins at a concentration of about 0.1–2.0%, an aqueous dispersion of (2) a water dispersible film forming carboxy-lower alkyl cellulose polymer at a concentration of about 0.0035–10%, and (3) as a curing agent, an aqueous solution of a water soluble salt alone and prior to the application of said light sensitive layer, said salt being that of a metal of the glass consisting of zirconium, hafnium, titanium and thorium, said coating being substantially free of unreacted salts of said metal, the salt being at a concentration of about 0.01–10%, all said amounts being by weight; and washing said thusly coated base member with water.

21. The method of making a plate base adapted to receive a light sensitive layer to provide a presensitized lithographic plate, comprising: forming a coating by applying to a base member an aqueous dispersion of (1) a water dispersible member of the class consisting of amine modified urea-formaldehyde resins, alkali metal sulfurous acid salt modified urea-formaldehyde resins, alkylated methylol melamine resins, and melamine-formaldehyde-polyalkylenepolyamine resins at a concentration of about 0.1–2.0%, an aqueous dispersion of (2) a water dispersible film forming member of the class consisting of carboxymethyl cellulose and carboxymethyl-hydroxyethyl cellulose polymer at a concentration of about 0.0035–10.0%, and (3) as a curing agent, an aqueous solution of a water soluble salt alone and prior to the application of said light sensitive layer, said salt being that of a metal of the class consisting of zirconium, hafnium, titanium and thorium, said coating being substantially free of unreacted salts of said metal, the salt being at a concentration of about 0.01–10.0%, all said amounts being by weight; and washing said thusly coated base member with water.

22. The method of making a plate base adapted to receive a light sensitive layer to provide a presensitized lithographic plate, comprising: forming a coating by applying to a base member an aqueous dispersion of (1) a water dispersible member of the class consisting of amine modified urea-formaldehyde resins, alkali metal sulfurous acid salt modified urea-formaldehyde resins, alkylated methylol melamine resins, and melamine-formaldehyde-polyalkylene-polyamine resins at a concentration of about 0.1–2.0%, an aqueous dispersion of (2) a water dispersible film forming member of the class consisting of carboxymethyl cellulose and carboxymethyl-hydroxyethyl cellulose polymer, and (3) as a curing agent, a water soluble zirconium salt alone and prior to the application of said light sensitive layer, said coating being substantially free of unreacted zirconium salt.

References Cited in the file of this patent

UNITED STATES PATENTS

| | | |
|---|---|---|
| 2,635,537 | Worthen | Apr. 21, 1953 |
| 2,796,362 | Wooding et al. | June 18, 1957 |
| 2,873,207 | Weegar et al. | Feb. 10, 1959 |

FOREIGN PATENTS

| | | |
|---|---|---|
| 763,066 | France | Feb. 5, 1934 |

OTHER REFERENCES

Partington: Text-Book of Inorganic Chemistry, 1953, Macmillan and Co., London, inside back cover.

Synethic Resins for Coatings, copyright 1947, by Resinous Products and Chemical Co., Philadelphia, pages 66 and 67.